United States Patent
Almendros et al.

(10) Patent No.: US 12,348,229 B2
(45) Date of Patent: Jul. 1, 2025

(54) CONTINUOUS PHASE MAINTENANCE FOR SWITCHED FREQUENCIES USING PHASE ACCUMULATORS

(71) Applicant: Keysight Technologies, Inc., Santa Rosa, CA (US)

(72) Inventors: Marc Almendros, Barcelona (ES); Gidget A. Heintz, Fort Collins, CO (US); John H. Guilford, Stanwood, WA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 63 days.

(21) Appl. No.: 18/120,273

(22) Filed: Mar. 10, 2023

(65) Prior Publication Data

US 2024/0305281 A1    Sep. 12, 2024

(51) Int. Cl.
*H03K 5/01* (2006.01)
*H03K 5/00* (2006.01)

(52) U.S. Cl.
CPC ..... *H03K 5/01* (2013.01); *H03K 2005/00286* (2013.01)

(58) Field of Classification Search
CPC ............... H03K 5/01; H03K 2005/00286
USPC .................................................. 327/231
See application file for complete search history.

(56) References Cited

U.S. PATENT DOCUMENTS

| | | | | |
|---|---|---|---|---|
| 4,992,743 A | * | 2/1991 | Sheffer | G06F 1/0342 332/149 |
| 5,371,765 A | * | 12/1994 | Guilford | G06F 1/0328 327/107 |
| 5,399,984 A | | 3/1995 | Frank | |
| 6,614,813 B1 | * | 9/2003 | Dudley | G06F 1/0335 370/532 |
| 6,867,625 B1 | * | 3/2005 | Stoyanov | H03B 21/00 327/107 |
| 7,268,594 B1 | * | 9/2007 | Alfke | G06F 1/025 327/107 |
| 7,284,025 B2 | * | 10/2007 | Sullivan | G06F 1/0328 708/271 |
| 7,952,516 B2 | * | 5/2011 | Atherton | G01S 7/282 342/201 |
| 9,432,079 B1 | * | 8/2016 | Kumar | H04B 17/345 |
| 9,520,831 B1 | * | 12/2016 | Foster | G06F 1/0321 |

(Continued)

OTHER PUBLICATIONS

"AD9164: 16-Bit, 12 GSPS, RF DAC and Direct Digital Synthesizer", Analog Devices, Rev. D., 2016, pp. 1-137.

*Primary Examiner* — Ryan Jager

(57) ABSTRACT

An integrated phase accumulator apparatus includes a first phase accumulator, a second phase accumulator, and a switch. The first phase accumulator is configured to accumulate a first phase increment over time and provide a first accumulated phase value for signal generation via a local oscillator at a first frequency. The second phase accumulator is configured to accumulate a second phase increment over time and provide a second accumulated phase value for signal generation via the local oscillator at a second frequency. The switch is configured to switch the integrated phase accumulation apparatus between the first frequency and the second frequency and between the second frequency and the first frequency so as to maintain a first continuous phase for the first frequency and a second continuous phase for the second frequency.

20 Claims, 7 Drawing Sheets

(56) References Cited

U.S. PATENT DOCUMENTS 10,917,077 B1\* 2/2021 Boumaalif ............ G06F 1/0335
2024/0305281 A1\* 9/2024 Almendros .............. H03K 5/01

\* cited by examiner

CONTINUOUS PHASE MAINTENANCE FOR SWITCHED FREQUENCIES USING PHASE ACCUMULATORS

BACKGROUND

A signal generator may sometimes be switched from one frequency to another frequency, such as during a test of a device under test (DUT). In a traditional implementation of a numerically controlled oscillator used in a signal generator, a phase increment fed into a phase accumulator is changed to change the frequency of local oscillator (LO) output. A problem that has not yet been satisfactorily solved occurs when a phase accumulator is sometimes switched back to an original frequency. The phase for the output signal at the original frequency will be discontinuous compared to the phase for the output signal that would exist if the phase accumulator had not been switched to the other frequency and then back.

Phase coherency is increasingly important in frequency management and phase management for controlling qubit base primitives using a digital up or down converter while operating in real-time operation manipulation. A quantum logic gate is a basic quantum circuit operating on a small number of qubits, and each qubit is a basic unit of quantum information. That is, a qubit is a two-state quantum mechanical system. As one example of the importance of such discontinuities, data from frequencies faster than traditional frequencies may require supersampling by processing of multiple samples in every clock in order to maintain phase. However, if a phase accumulator provided with supersampling circuitry is switched back and forth between frequencies, the discontinuity problem remains.

SUMMARY

According to an aspect of the present disclosure, an integrated phase accumulator apparatus includes a first phase accumulator, a second phase accumulator, and a switch. The first phase accumulator is configured to accumulate a first phase increment over time and provide a first accumulated phase value for signal generation via a local oscillator at a first frequency. The second phase accumulator is configured to accumulate a second phase increment over time and provide a second accumulated phase value for signal generation via the local oscillator at a second frequency. The switch is configured to switch the integrated phase accumulation apparatus between the first frequency and the second frequency and between the second frequency and the first frequency so as to maintain a first continuous phase for the first frequency and a second continuous phase for the second frequency.

According to another aspect of the present disclosure, a signal generator includes a first integrated phase accumulator apparatus and a second integrated phase accumulation apparatus. The first integrated phase accumulation apparatus comprises a first phase accumulator, a second phase accumulator, and a first switch. The second integrated phase accumulation apparatus comprises a third phase accumulator, a fourth phase accumulator, and a second switch. The first phase accumulator is configured to accumulate a first phase increment over time and provide a first accumulated phase value for signal generation via a first local oscillator at a first frequency. The second phase accumulator is configured to accumulate a second phase increment over time and provide a second accumulated phase value for signal generation via the first local oscillator at a second frequency. The first switch is configured to switch the first integrated phase accumulation apparatus between the first frequency and the second frequency and between the second frequency and the first frequency so as to maintain a first continuous phase for the first frequency and a second continuous phase for the second frequency. The third phase accumulator is configured to accumulate a third phase increment over time and provide a third accumulated phase value for signal generation via a second local oscillator at a third frequency. The fourth phase accumulator is configured to accumulate a fourth phase increment over time and provide a fourth accumulated phase value for signal generation via the second local oscillator at a fourth frequency. The second switch is configured to switch the first integrated phase accumulation apparatus between the third frequency and the fourth frequency and between the fourth frequency and the third frequency so as to maintain a third continuous phase for the third frequency and a fourth continuous phase for the fourth frequency.

According to another aspect of the present disclosure, an integrated phase accumulator system includes a first phase accumulator with a first instance of a sampling circuit, a second phase accumulator with a second instance of a sampling circuit, a switch, and at least one additional set of at least one additional sampling circuit. The first phase accumulator is configured to accumulate a first phase increment over time and provide a first accumulated phase value for signal generation via a local oscillator at a first frequency. The second phase accumulator is configured to accumulate a second phase increment over time and provide a second accumulated phase value for signal generation via the local oscillator at a second frequency. The switch is configured to switch the integrated phase accumulation apparatus between the first frequency and the second frequency and between the second frequency and the first frequency so as to maintain a first continuous phase for the first frequency and a second continuous phase for the second frequency. The at least one additional set of at least one additional sampling circuit is configured for supersampling, and may include one or more additional sampling circuits provided in the first phase accumulator and the second phase accumulator or outside of the first phase accumulator and the second phase accumulator to be shared by the first phase accumulator and the second phase accumulator.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2B illustrates a system with signal generators for continuous phase maintenance for switched frequencies using phase accumulators, in accordance with a representative embodiment.

DETAILED DESCRIPTION

Figure 1:
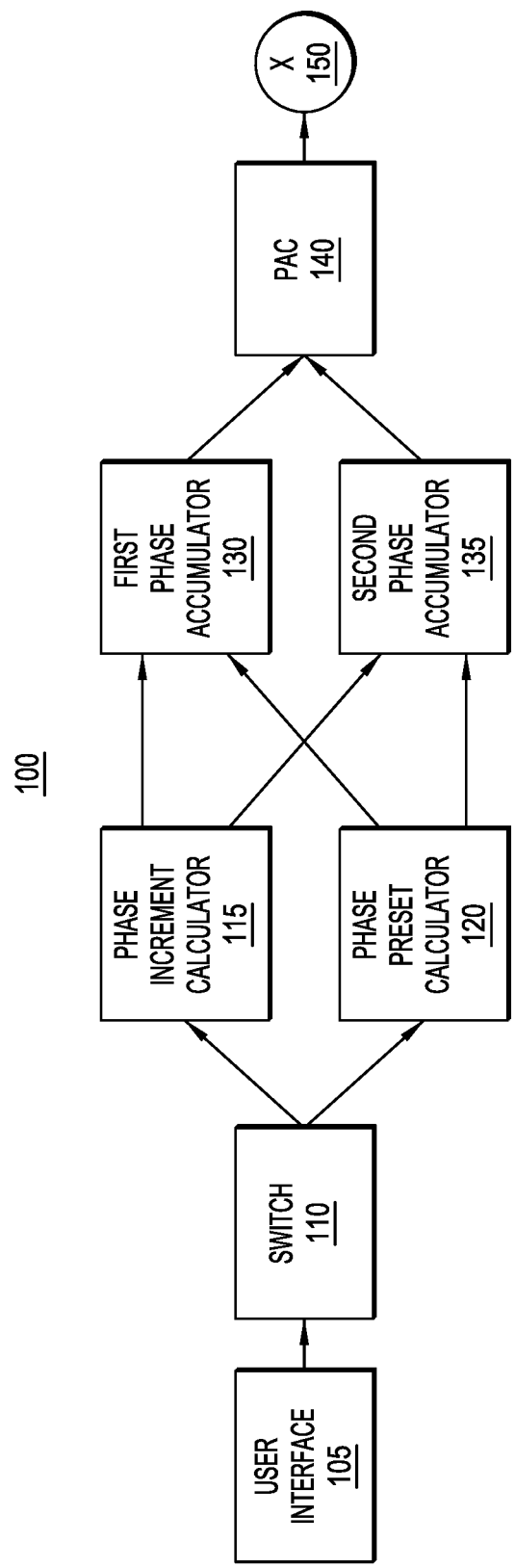
FIG. 1 illustrates a system for continuous phase maintenance for switched frequencies using phase accumulators, in accordance with a representative embodiment.

In the following detailed description, for the purposes of explanation and not limitation, representative embodiments disclosing specific details are set forth in order to provide a thorough understanding of embodiments according to the present teachings. However, other embodiments consistent with the present disclosure that depart from specific details disclosed herein remain within the scope of the appended claims. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. Definitions and explanations for terms herein are in addition to the technical and scientific meanings of the terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

The present disclosure, through one or more of its various aspects, embodiments and/or specific features or sub-components, is thus intended to bring out one or more of the advantages as specifically noted below.

As described herein, phase continuous operations may be provided in a system in which frequencies are changed. Phase continuity may be maintained when frequencies are changed for frequency and phase management for controlling quantum bit (qubit) gate primitives using a digital up down converter while operating in a real-time operation manipulation. Operations of the system may be returned to an earlier frequency such that the earlier frequency is phase continuous as if the frequency had not been changed. The teachings herein allow for multiple digital local oscillators to be frequency and phase multiplexed in a way that allows for phase continuous operation, while avoiding discontinuity in phase output which occurs in the traditional implementations of a numerically controlled oscillator (NCO) when the frequency of the local oscillator output is changed by changing the phase increment fed into a phase accumulator.

FIG. 1 illustrates a system for continuous phase maintenance for switched frequencies using phase accumulators, in accordance with a representative embodiment.

The system 100 in FIG. 1 may comprise an integrated phase accumulator apparatus. The system 100 includes a user interface 105, a switch 110, a phase increment calculator 115, a phase preset calculator 120, a first phase accumulator 130, a second phase accumulator 135, a phase-to-amplitude converter 140, and a modulator 150. The number of phase accumulators in the system 100 is not particularly limited to two. As an example, the system 100 may comprise sixteen phase accumulators in a single signal source, and four signal sources each with sixteen phase accumulators.

The user interface 105 may comprise one or more of an interactive touchscreen with options such as soft buttons, one or more hard buttons, a toggle, or another mechanism by which a user may control the system 100 to switch between frequencies, such as in a test environment.

The switch 110 may be a switch that is activated and/or otherwise controlled via the user interface 105. The switch 110 may be configured to switch the system 100 between a first frequency and a second frequency and between the second frequency and the first frequency so as to maintain a first continuous phase for the first frequency and a second continuous phase for the second frequency. Although the switch 110 is illustrated to be between the user interface 105 and the phase increment calculator 115 and phase preset calculator 120, this arrangement is not particularly required. Additionally, while the switch 110 is shown as a singular component in FIG. 1, the switch 110 may comprise a plurality of switches in a switching network that can be used to logically switch the frequency of the output of the system 100 based on input to the user interface 105.

The phase increment calculator 115 and the phase preset calculator 120 may receive a selected frequency input via the user interface 105. The phase preset calculator 120 may also receive a system clock Fclk, as shown in and described below with respect to FIG. 2A. The phase increment calculator 115 is configured to repeatedly determine and output a phase increment $\Phi inc$ for the selected frequency, as shown in and described below with respect to FIG. 2A. The phase preset calculator 120 is configured to output a phase preset value $\Phi_N(t)$, as shown in and described below with respect to FIG. 2A.

The first phase accumulator 130 is configured to accumulate a first phase increment over time and provide a first accumulated phase value for signal generation via a local oscillator at a first frequency. The second phase accumulator 135 is configured to accumulate a second phase increment over time and provide a second accumulated phase value for signal generation via the local oscillator at a second frequency. The system 100 is configured to switch back and forth between the first phase accumulator 130 and the second phase accumulator 135 based on input to the user interface 105, while maintaining the phase continuity of the accumulated phase values from the first phase accumulator 130 and the second phase accumulator 135. Additionally, the first frequency and the second frequency may be different or may be the same. For example, a different between the first frequency and the second frequency may be an offset between phases of the accumulated phase values from the first phase accumulator 130 and the second phase accumulator 135.

The phase-to-amplitude converter 140 (PAC) is configured to convert the accumulated phase value output from the first phase accumulator 130 to a first periodic analog signal having the first frequency and the accumulated phase value output from the second phase accumulator 135 to a second periodic analog signal having the second frequency. The phase-to-amplitude converter 140 outputs a periodic analog signal to the modulator 150. The phase-to-amplitude converter 140 may select between the output from the first phase accumulator 130 and the output from the second phase accumulator 134. Alternatively, the phase-to-amplitude converter 140 may be representative of multiple phase-to-amplitude converters such that outputs from the first phase accumulator 130 and the second phase accumulator 135 are provided to different phase-to-amplitude converters and a switch (not shown in FIG. 1.) is used to select between outputs of the different phase-to-amplitude converters. The modulator 150 may be configured to output a modulated signal based on the accumulated phase value output from the phase-to-amplitude converter 140 to a digital-to-analog converter, as shown in and described below with respect to FIG. 2A. Additionally, while the phase-to-amplitude converter 140 is shown as a singular component in FIG. 1, the phase-to-amplitude converter 140 may comprise a plurality of phase-to-amplitude converters that can be used to output accumulated phase values. For example, each phase accumulator in the system 100 may be provided separately with a different phase-to-amplitude converter.

In FIG. 1, two phase accumulators are shown. However, the teachings herein are not limited to two phase accumulators for any particular system or device such as a signal generator. Rather, more than two phase accumulators may be accommodated in any single system or device, so that more than two continuous phases may be maintained as the system or device switches between the phase accumulators. In some embodiments, a signal generator may include two or more integrated phase accumulation apparatuses, and each integrated phase accumulator apparatus may in turn comprise two or more phase accumulators so that multiple continuous phases may be maintained for each integrated phase accumulation apparatus as the signal generator switches between the integrated phase accumulation apparatuses and the phase accumulators in the integrated phase accumulation apparatuses.

Figure 2A:
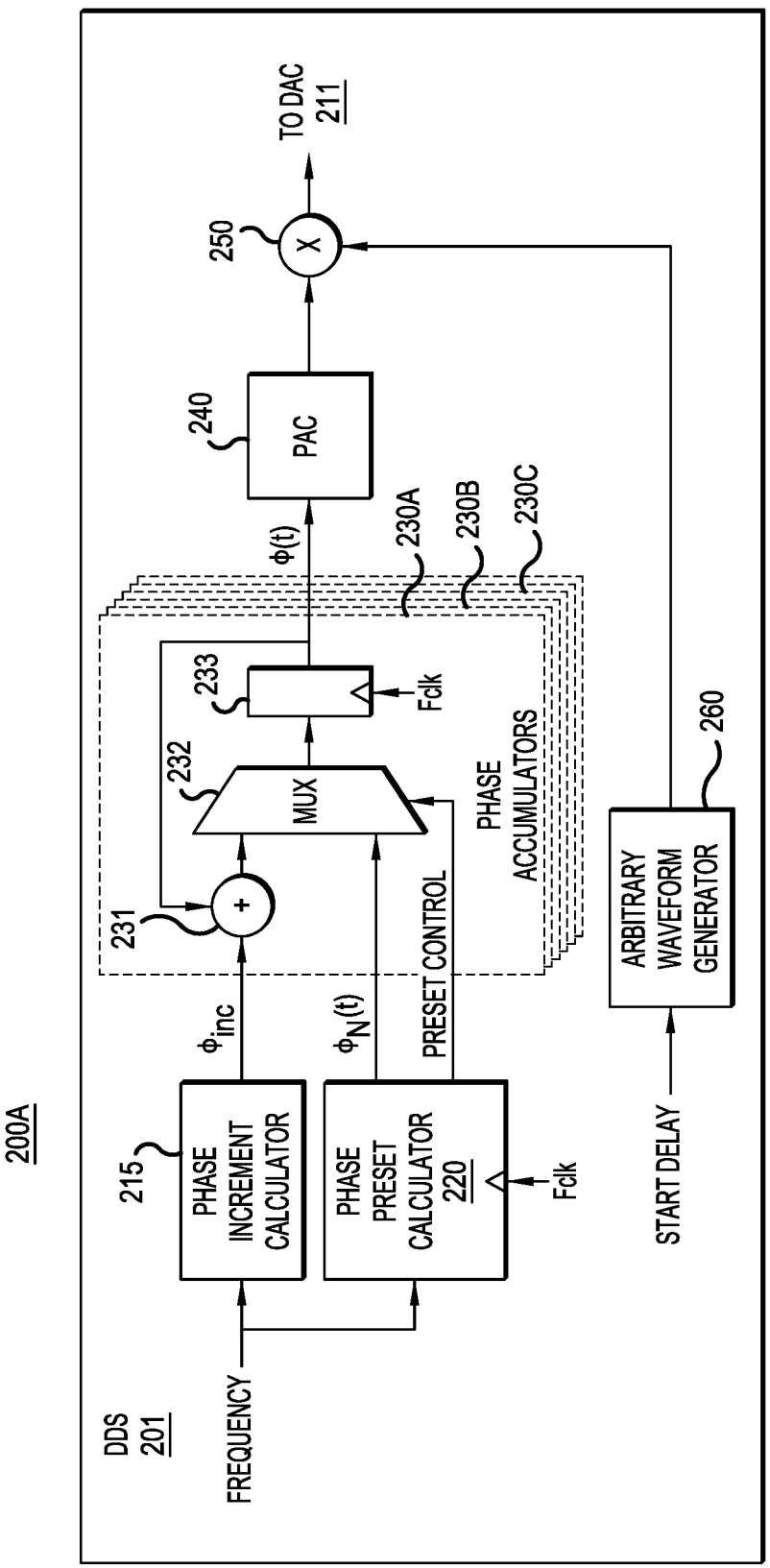
FIG. 2A illustrates a signal generator for continuous phase maintenance for switched frequencies using phase accumulators, in accordance with a representative embodiment.

FIG. 2A illustrates a signal generator for continuous phase maintenance for switched frequencies using phase accumulators, in accordance with a representative embodiment.

The signal generator 200A in FIG. 2A comprises a direct digital synthesizer 201.

The direct digital synthesizer 201 in FIG. 2A includes a phase increment calculator 215, a phase preset calculator 220, phase accumulators 230, a phase-to-amplitude converter 240 (PAC), a modulator 250, and an arbitrary waveform generator 260. The phase accumulators 230 include at least a first phase accumulator 230A, a second phase accumulator 230B and a third phase accumulator 230C. Each of the phase accumulators 230 includes an adder, a multiplexer and a latch. The illustrative instance of the first phase accumulator 230A shown in FIG. 2A includes an adder 231, a multiplexer 232 and a latch 233, though each of the phase accumulators 230 may include identical or at least similar circuit elements. The number of instances of the phase accumulators in FIG. 2A is not limited to three. Rather, the number of instances of the phase accumulators in a signal generator 200A may be as few as two or more than two such as sixteen or one hundred twenty eight.

The phase increment calculator 215 and the phase preset calculator 220 receive a selected frequency. The phase preset calculator 220 and the latch 233 of the phase accumulator 230 receive a system clock Fclk. The system clock Fclk may be provided by a host device (not shown), as an example. The selected frequency input to the phase increment calculator 215 and the phase preset calculator 220 may be input by a system user such as via the user interface 105 in FIG. 1 or via a host device (not shown) to control operation of the direct digital synthesizer 201. The system clock Fclk in FIG. 2A shows that the phase preset calculator 220 and the latch 233 in the phase accumulator 230 are controlled with the same clock and therefore have the same meaning of time.

The phase preset calculator 220 is configured to output a phase preset value $\Phi_N(t)$ along with a preset control signal to the multiplexer 232.

The phase increment calculator 215 is configured to repeatedly determine a phase increment $\Phi inc$ for the selected frequency. The phase increment calculator 215 provides the determined phase increment $\Phi inc$ to the adder 231 of the phase accumulator 230.

Each of the phase accumulators 230 is configured to accumulate the phase increment $\Phi inc$ from the phase increment calculator 215 over time and provide an accumulated phase value $\Phi(t)$ as an output of its latch. Operations for each of the phase accumulators 230 are next explained in terms of the first phase accumulator 230A as an illustrative example.

For the first phase accumulator 230A, the accumulated phase value $\Phi(t)$ is output by the latch 233 to the phase-to-amplitude converter 240 (PAC). The determined phase increment $\Phi inc$ for the selected frequency from the phase increment calculator 215 is output to the adder 231 of the first phase accumulator 230A from the phase increment calculator 215. Additionally, the accumulated phase value $\Phi(t)$ output from the latch 233 each clock period of a system clock Fclk is fed back to the adder 231 and also provided to the phase-to-amplitude converter 240. The adder 231 is configured to add the determined phase increment $\Phi inc$ for the selected frequency from the phase increment calculator 215 and the accumulated phase value $\Phi(t)$ output from the latch 233 at each clock period of the system clock Fclk. The adder 231 is configured to add each new phase increment $\Phi inc$ to the previous accumulated phase value $\Phi(t)$ output from the latch 233.

The multiplexer 232 receives the added output from the adder 231 and the phase preset value $\Phi N(t)$ from phase preset calculator 220. The multiplexer 232 also receives a preset control signal from the phase preset calculator 220. The preset control signal from the phase preset calculator 220 switches the multiplexer 232 to selectively output either the added output from the adder 231 or the phase preset value $\Phi N(t)$ from the phase preset calculator 220. The preset control signal will control when the first phase accumulator 230A is to be preset to the phase preset value $\Phi N(t)$ or will increment the stored value by the phase increment $\Phi inc$. The preset control signal will only select the phase preset value in response to a controlling event to the phase preset calculator 220.

The latch 233 is clocked at the same clock rate as the phase preset calculator 220 using the system clock Fclk. The latch 233 latches the multiplexed output from the multiplexer 232 and provides the latched output of the accumulated phase value $\Phi(t)$ to the phase-to-amplitude converter 240 (PAC).

The phase-to-amplitude converter 240 (PAC) is configured to convert the accumulated phase value Φ(t) to a periodic analog signal having the selected frequency. The phase-to-amplitude converter 240 outputs the periodic analog signal to the modulator 250.

The arbitrary waveform generator 260 generates an arbitrary waveform to be provided to the modulator 250. The arbitrary waveform may be dynamically generated or retrieved from a plurality of waveforms based on data stored in a memory of the arbitrary waveform generator 260. The signal generated by the signal generator 200A is based on the arbitrary waveform from the arbitrary waveform generator 260 and the periodic analog signal output from the phase-to-amplitude converter 240. The modulator 250 modulates the periodic analog signal having the selected frequency from the phase-to-amplitude converter 240 and the arbitrary waveform from the arbitrary waveform generator 260. The modulator 250 outputs a modulated signal to a digital-to-analog converter 211 (DAC) (not shown).

In FIG. 2A, three phase accumulators are labelled. However, the teachings herein are not limited to three phase accumulators for any particular system or device such as a signal generator. Rather, more than two or more phase accumulators may be accommodated in any single system or device, so that more than two continuous phases may be maintained as the system or device switches between the phase accumulators. In some embodiments, a signal generator may include two or more integrated phase accumulation apparatuses, and each integrated phase accumulator apparatus may in turn comprise two or more phase accumulators.

Figure 2B:
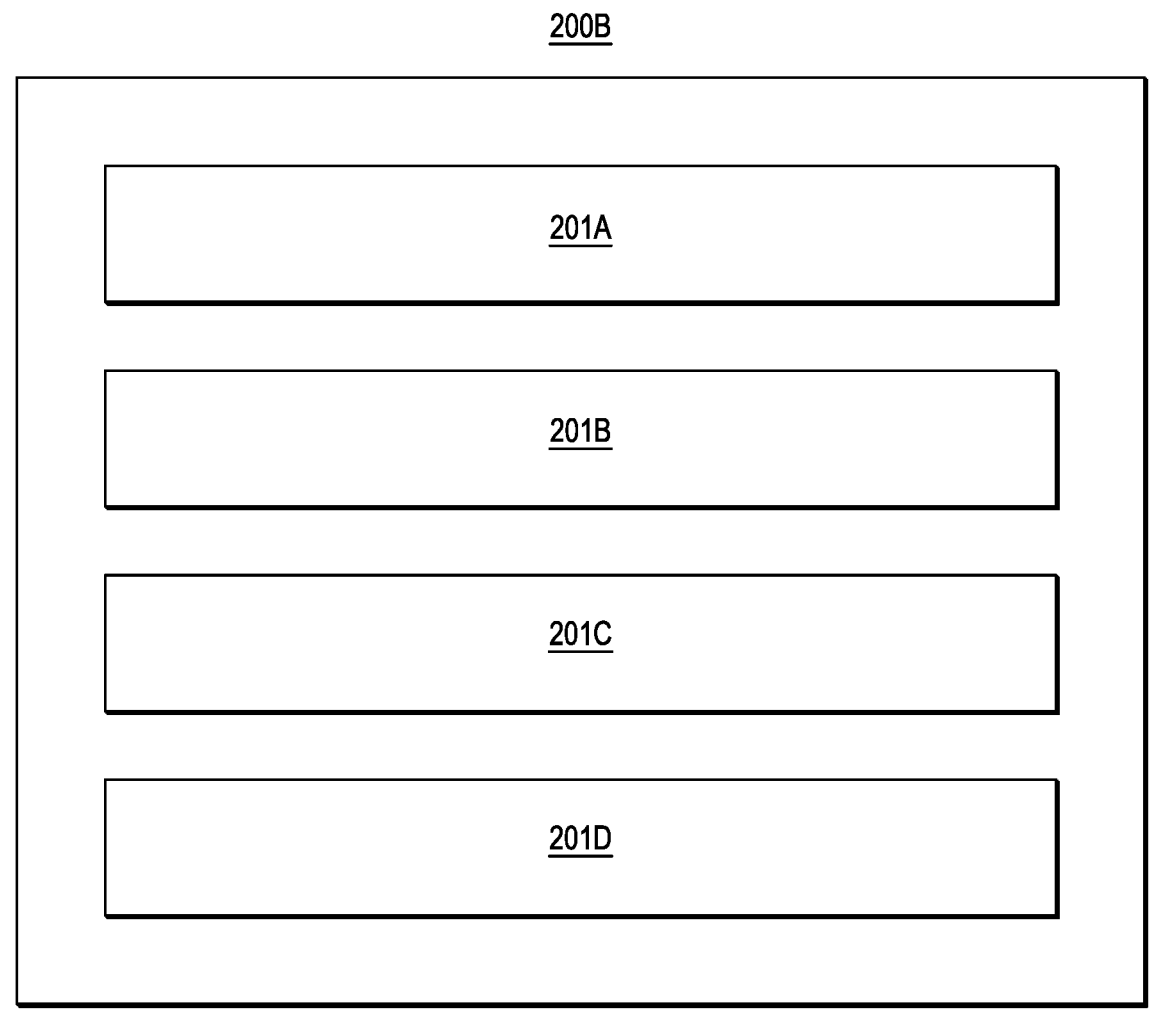

FIG. 2B illustrates a system with signal generators for continuous phase maintenance for switched frequencies using phase accumulators, in accordance with a representative embodiment.

The system 200B in FIG. 2B includes a first signal source 201A, a second signal source 201B, a third signal source 201C and a fourth signal source 201D. Each of the signal sources in the system 200B may include the configuration of the signal generator 200A in FIG. 2A. The system 200B illustrates that a single integrated device or system may comprise multiple signal sources, and each of the signal sources may comprise two or more phase accumulators. For example, an integrated phase accumulator apparatus comprising any one of the signal sources in FIG. 2B may include a first phase accumulator, a second phase accumulator, and a third phase accumulator, along with a switch configured to switch outputs from the first phase accumulator, the second phase accumulator and the third phase accumulator. Each phase accumulator may continue operating even when the output of the integrated phase accumulator apparatus is switched away, so that when switched back the output of the phase accumulator has phase continuity as if the switching back and forth had not occurred. A user may provide input such as to the user interface 105 in FIG. 1, and switch between the phase accumulators of an integrated phase accumulator apparatus, and between different phase accumulators of different integrated phase accumulator apparatuses.

Figure 3:
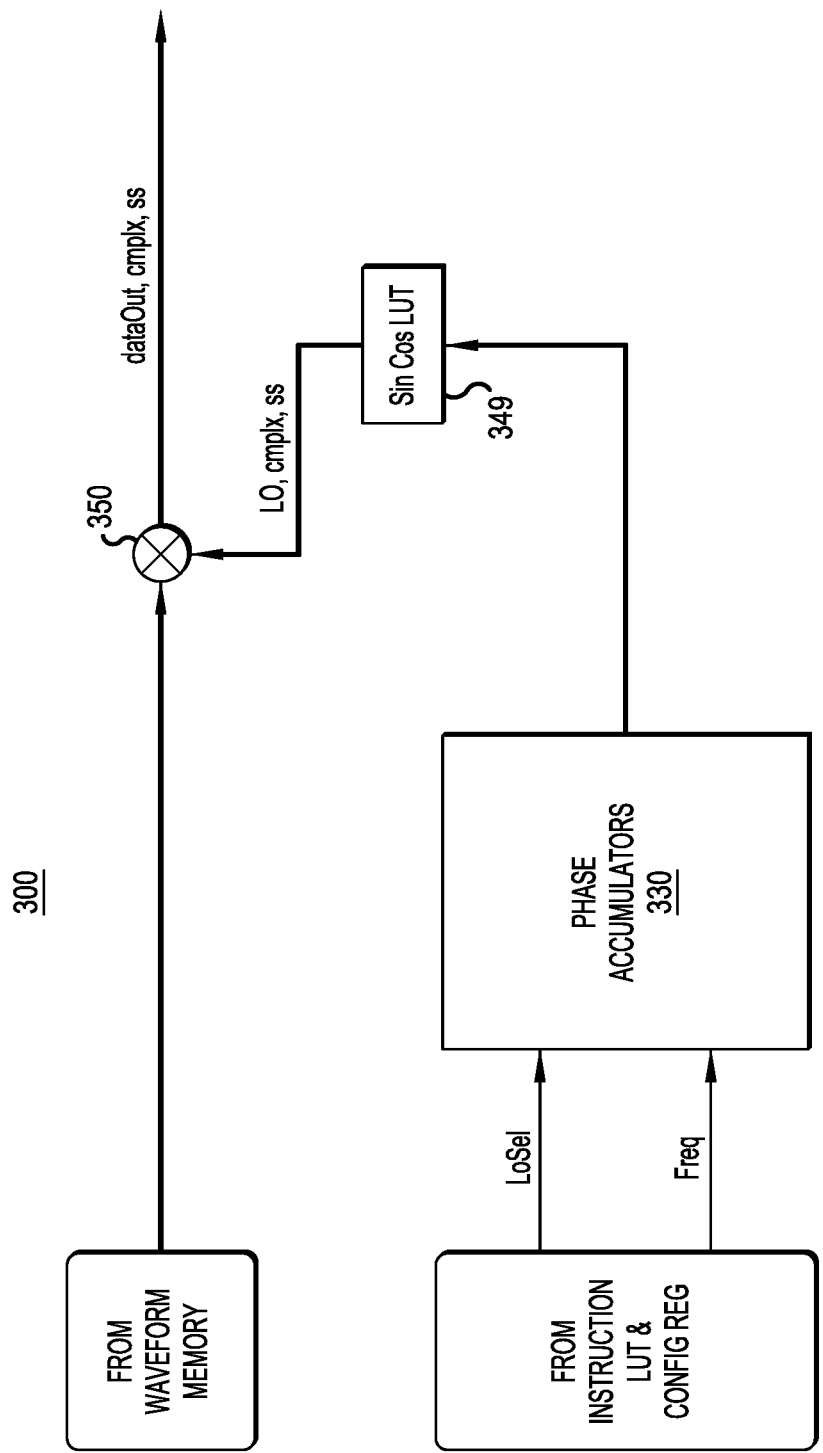
FIG. 3 illustrates a system for continuous phase maintenance for switched frequencies using phase accumulators, in accordance with a representative embodiment.

FIG. 3 illustrates a system for continuous phase maintenance for switched frequencies using phase accumulators, in accordance with a representative embodiment.

The system 300 in FIG. 3 includes phase accumulators 330, a sine/cosine LUT 349 (look up table), and a modulator 350. The system 300 may also include other elements such as a waveform memory, an instruction look up table, and/or a configuration register.

The phase accumulators 330 drive the sine/cosine LUT 349. The sine/cosine LUT 349 may comprise a logic circuit such as an application-specific integrated circuit (ASIC). The system 300 implements a digital up or down converter that may process supersampled data. That is, the system 300 may process multiple samples per clock, though the system 300 and teachings herein more generally are not limited to processing of supersampled data. Supersampling involves processing of multiple samples in every clock in order to maintain phase, and is increasingly used as higher frequency ranges are increasingly used.

The phase accumulators 330 and the sine/cosine LUT 349 may be implemented in a numerically controlled oscillator (NCO). For example, the system 300 may comprise a numerical controlled oscillator (NCO) and, as such may comprise a signal generator with two primary data paths. One of the two primary data paths may comprise a DC path and may bypass the local oscillator (LO) mixer. The other of the two primary data paths may comprise the main path and may include the local oscillator (LO) mixer. The system 300 allows a user to control amplitude of both the data in the DC path and the main path via signals (not shown) for amplitude and DCamplitude. The system 300 may also allow user modification of the phase of the local oscillator (LO) both on a temporary basis via a phase input, and on a permanent basis, via a PhaseBump signal which alters the values of the phase accumulators 330.

In a traditional implementation of a numerically controlled oscillator, the frequency of the local oscillator output is changed by changing the phase increment fed into the phase accumulator. However, if the user changes from one frequency, f1, to a different frequency, f2, then it is difficult to switch back to f1 while maintaining the same phase of the output signal the local oscillator would have had if the frequency had remained at f1. One potential way to solve this would be to create a plurality of local oscillators and switch between them, but this then requires needless copies of a logic circuit used to implement the sine/cosine LUT or another form of generation logic as well as multiple local oscillators. According to the teachings herein, a single instance of the sine/cosine LUT 349 may be used with a plurality of phase accumulators shown as the phase accumulators 330 in FIG. 3 and other embodiments.

By changing an input (the LoSel in FIG. 3), a user can switch to a different phase accumulator while allowing the original phase accumulator to continue accumulating its phase and remaining phase coherent. When the user later switches back to the original phase accumulator, the changed output of the local oscillator will have the same phase as if it had not been changed temporarily to a different frequency. The number of phase accumulators in the phase accumulators 330 may vary from two up to some larger number. The number of phase accumulators in the phase accumulators 330 may comprise the maximum number of phase continuous signals the system 300 may keep track of.

Figure 4:
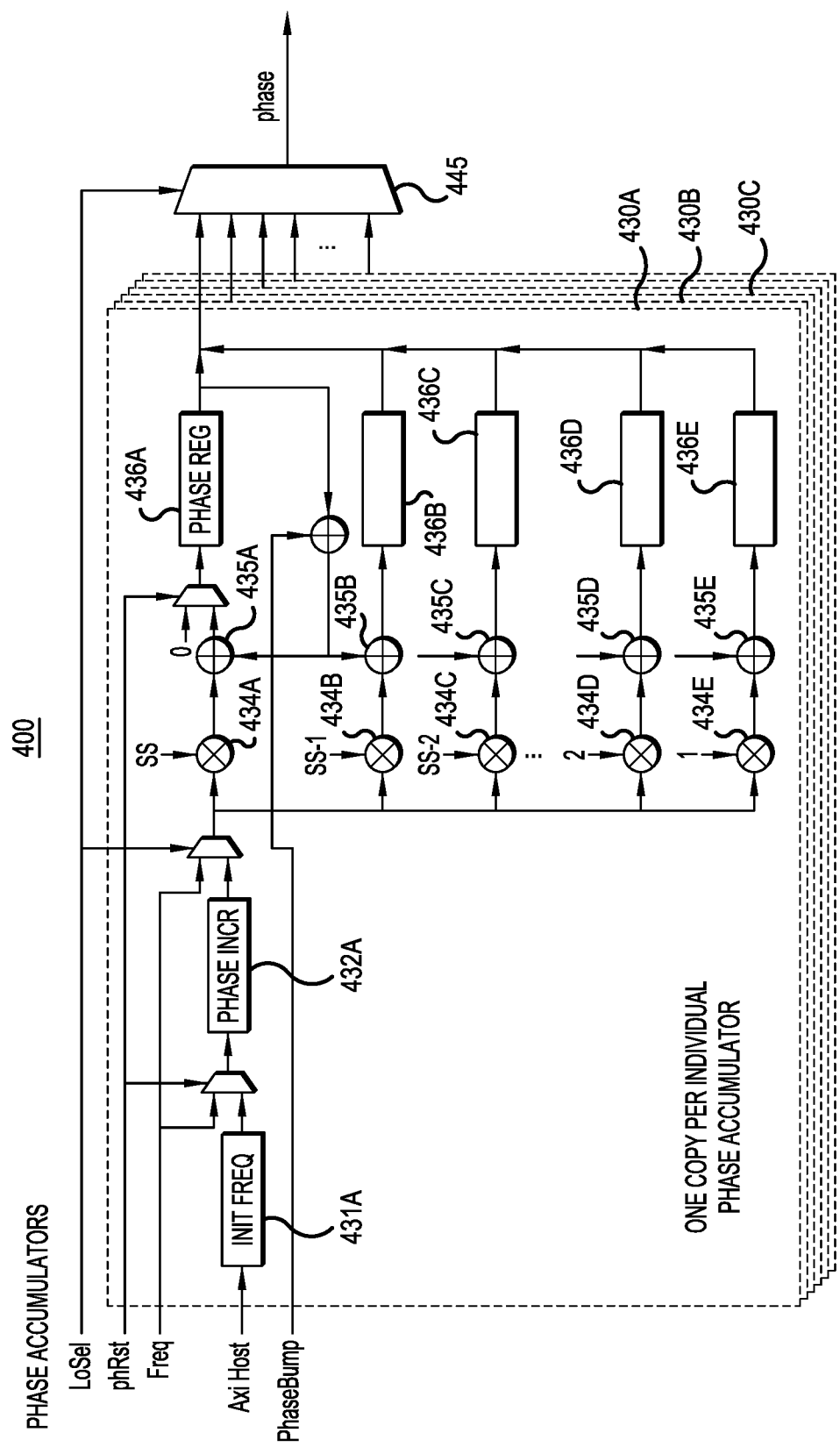
FIG. 4 illustrates a system for continuous phase maintenance for switched frequencies using phase accumulators, in accordance with a representative embodiment.

FIG. 4 illustrates a system for continuous phase maintenance for switched frequencies using phase accumulators, in accordance with a representative embodiment.

The system 400 includes a plurality of phase accumulators including at least a first phase accumulator 430A, a second phase accumulator 430B, and a third phase accumulator 430C, along with a multiplexer 445. In some embodiments, the system 400 may include sixteen or more phase accumulators. Other than the multiplexer 445, the circuit elements detailed in FIG. 4 are largely attributable to the first phase accumulator 430A. Each of the other phase accumulators may have the same or a similar circuit layout as the first phase accumulator 430A.

The system 400 in FIG. 4 includes multiple registers for the first phase accumulator 430A. The multiple registers include an initial frequency register 431A, a phase increment register 432A, a first phase register 436A, a second phase register 436B, a third phase register 436C, a fourth phase register 436D and a fifth phase register 436E. The system 400 also includes a first multiplier 434A, a second multiplier 434B, a third multiplier 434C, a fourth multiplier 434D, and a fifth multiplier 434E. Each multiplier calculates a multiples of the phase increment from the phase increment register 432A The system 400 also includes a first adder 435A, a second adder 435B, a third adder 435C, a fourth adder 435D, and a fifth adder 435E.

The second through fifth register, multiplier and adder are provided as examples of supersampling circuitry, and are used when the system 400 is being used for a high-frequency signal that requires more than one sample per clock period. That is, the first phase register 436A, the second phase register 436B, the third phase register 436C, the fourth phase register 436D and the fifth phase register 436E are used to support supersampled signals, though if supersampling is not needed only the top path through the first phase register 436A may suffice. The same is true for the multipliers and adders shown in FIG. 4.

In FIG. 4, the input Axi Host refers to a control interface used to control the continuous phase maintenance for switched frequencies using phase accumulators as described herein. For example, the input Axi Host may be provided from a user interface or a controller that controls the phase accumulators in the system 400.

The input PhaseBump may be used in some embodiments to allow changing the phase of the signal by a given amount, and is added to the output of the first phase register 436A.

The multiplexer 445 outputs phase to the local oscillator from one of the first phase accumulator 430A or the second phase accumulator 430B or the third phase accumulator 430C or another one of the phase accumulators in FIG. 4. The multiplexer 445 outputs phase to the local oscillator based on input from a user interface such as the user interface 105 in FIG. 1.

The design of the system 400 as shown also supports preloading of phase increment registers such as the phase increment register 432A with the initial frequencies needed by the user. Upon a phase reset (phRst), the initial frequencies are loaded into the phase increment registers including the phase increment register 432A and the phase accumulator registers are zeroed. This allows multiple different frequencies to start off with a known phase relationship between them.

In an embodiment based on the system 400 in FIG. 4, another set of user configurable registers may be provided to supply an initial phase for each phase accumulator register. In this case, phRst may load this value into the phase accumulator register rather than clearing it to zero.

An integrated phase accumulator system including the phase accumulators 430 in FIG. 4 may include the first phase accumulator 430A with a first instance of a sampling circuit (including the first multiplier 434A and the first adder 435A), the second phase accumulator 430B with a second instance of a sampling circuit, the third phase accumulator 430C with a third instance of a sampling circuit, a switch, and at least one additional set of at least one additional sampling circuit. The first phase accumulator 430A may be configured to accumulate a first phase increment over time and provide a first accumulated phase value for signal generation via a local oscillator at a first frequency. The second phase accumulator 430B may be configured to accumulate a second phase increment over time and provide a second accumulated phase value for signal generation via the local oscillator at a second frequency. The third phase accumulator 430C may be configured to accumulate a third phase increment over time and provide a third accumulated phase value for signal generation via the local oscillator at a third frequency. The switch is configured to switch the integrated phase accumulation apparatus between the first frequency, the second frequency and the third frequency so as to maintain a first continuous phase for the first frequency, a second continuous phase for the second frequency, and a third continuous phase for the third frequency. The at least one additional set of at least one additional sampling circuit is configured for supersampling, and may include the set of circuit elements from the second multiplier 434B to the fifth phase register 436E for the first phase accumulator 430A and duplicates of these circuit elements for each of the second phase accumulator 430B and the third phase accumulator 430C.

By duplicating the phase accumulators 430 in FIG. 4, phases for the signals output from the system 400 may be maintained to be continuous without requiring a different sine/cosine LUT or local oscillator for each frequency.

Figure 5:
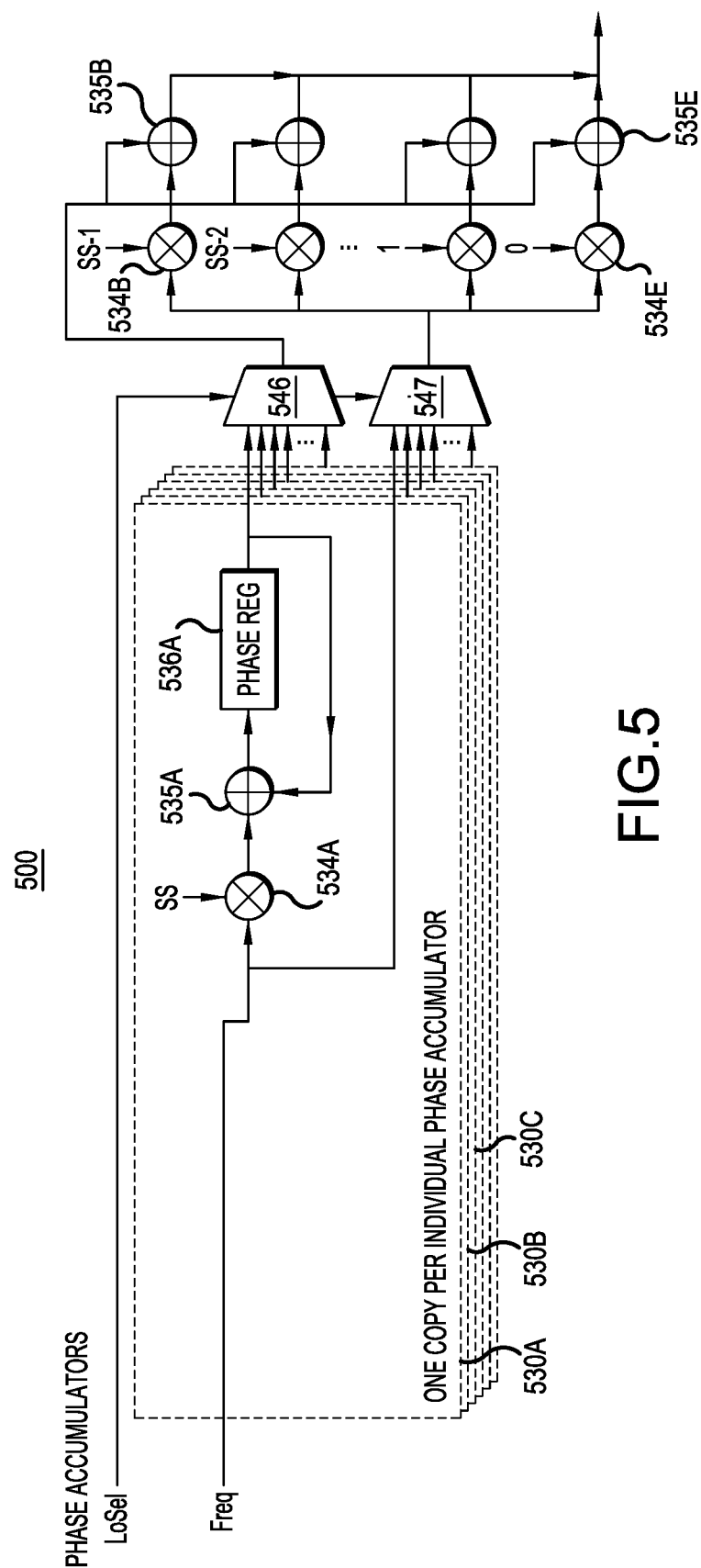
FIG. 5 illustrates a system for continuous phase maintenance for switched frequencies using phase accumulators, in accordance with a representative embodiment.

FIG. 5 illustrates a system for continuous phase maintenance for switched frequencies using phase accumulators, in accordance with a representative embodiment.

The first phase accumulator 530A in the system 500 in FIG. 5 includes a first multiplier 534A, a first adder 535A and the first phase register 536A. Each of the second phase accumulator 530B, the third phase accumulator 530C and any other phase accumulator in the system 500 may include duplicates of the circuit elements provided in the first phase accumulator 530A. The system 500 also includes a second multiplier 534B, a third multiplier 534C, a fourth multiplier 534D, and a fifth multiplier 534E. Each multiplier calculates a multiples of the phase increment from a phase increment register (not shown in FIG. 5). The system 500 also includes a second adder 535B, a third adder 535C, a fourth adder 535D, and a fifth adder 535E. The system 500 also includes a first multiplexer 546 and a second multiplexer 547.

The system 500 in FIG. 5 includes one first phase register 536A for a first phase accumulator 530A, and each other phase accumulator also has its own phase register. Other circuit components of the system 500 are placed outside of the phase accumulators so as to be shared by the phase accumulators as a group. The circuit components placed outside of the phase accumulators may include additional phase registers along with multipliers and adders from the second multiplier 534B to the fifth adder 535E.

The first phase accumulator 530A includes a first multiplier 534A and a first adder 535A. Each other phase accumulator including the second phase accumulator 530B and the third phase accumulator 530C includes a dedicated modulator, adder and phase register. Outputs of the phase accumulators are provided to a first multiplexer 546 and a second multiplexer 547, and the multiplexers are selectively switched by the local oscillator selection signal LoSel.

The individual phase registers of each phase accumulator and the collective circuit components placed outside of the phase accumulators are used to support supersampled signals, though if supersampling is not needed only the individual phase registers of each phase accumulator may suffice.

The design of the system 500 as shown also supports preloading of phase increment registers such as those shown in the system 400 of FIG. 4 with the initial frequencies needed by the user. Upon a phase reset (phRst), the initial frequencies are loaded into the phase increment registers and the phase accumulator registers are zeroed. This allows multiple different frequencies to start off with a known phase relationship between them.

In an embodiment based on the system 500 in FIG. 5, another set of user configurable registers may be provided to supply an initial phase for each phase accumulator register. In this case, phRst may load this value into the phase accumulator register rather than clearing it to zero.

An integrated phase accumulator system including the phase accumulators 530 in FIG. 5 may include the first phase accumulator 530A with a first instance of a sampling circuit (including the first multiplier 534A and the first adder 535A), the second phase accumulator 530B with a second instance of a sampling circuit, the third phase accumulator 530C with a third instance of a sampling circuit, a switch, and at least one additional set of at least one additional sampling circuit. The first phase accumulator 530A may configured to accumulate a first phase increment over time and provide a first accumulated phase value for signal generation via a local oscillator at a first frequency. The second phase accumulator 530B may be configured to accumulate a second phase increment over time and provide a second accumulated phase value for signal generation via the local oscillator at a second frequency. The third phase accumulator 530C may be configured to accumulate a third phase increment over time and provide a third accumulated phase value for signal generation via the local oscillator at a third frequency. The switch is configured to switch the integrated phase accumulation apparatus between the first frequency, the second frequency and the third frequency so as to maintain a first continuous phase for the first frequency, a second continuous phase for the second frequency, and a third continuous phase for the third frequency. The at least one additional set of at least one additional sampling circuit is configured for supersampling, and may include the set of circuit elements from 534B to 535E to be shared by the first phase accumulator 530A, the second phase accumulator 530B and the third phase accumulator 530C.

By duplicating the phase accumulators 530 in FIG. 5, phases for the signals output from the system 500 may be maintained to be continuous without requiring a different local oscillator for each frequency. This avoids duplicating hardware for duplicated local oscillators, including for example a sine/cosine LUT. Additionally, each of the phase accumulators may be simplified by removing some of the hardware and replacing the removed hardware with the at least one additional set of at least one additional sampling circuit shown on the right. That is, one sampling circuit is provided for each of the phase accumulators in FIG. 5, and offsets are added outside of the phase accumulators to generate other super sampled values.

Figure 6:
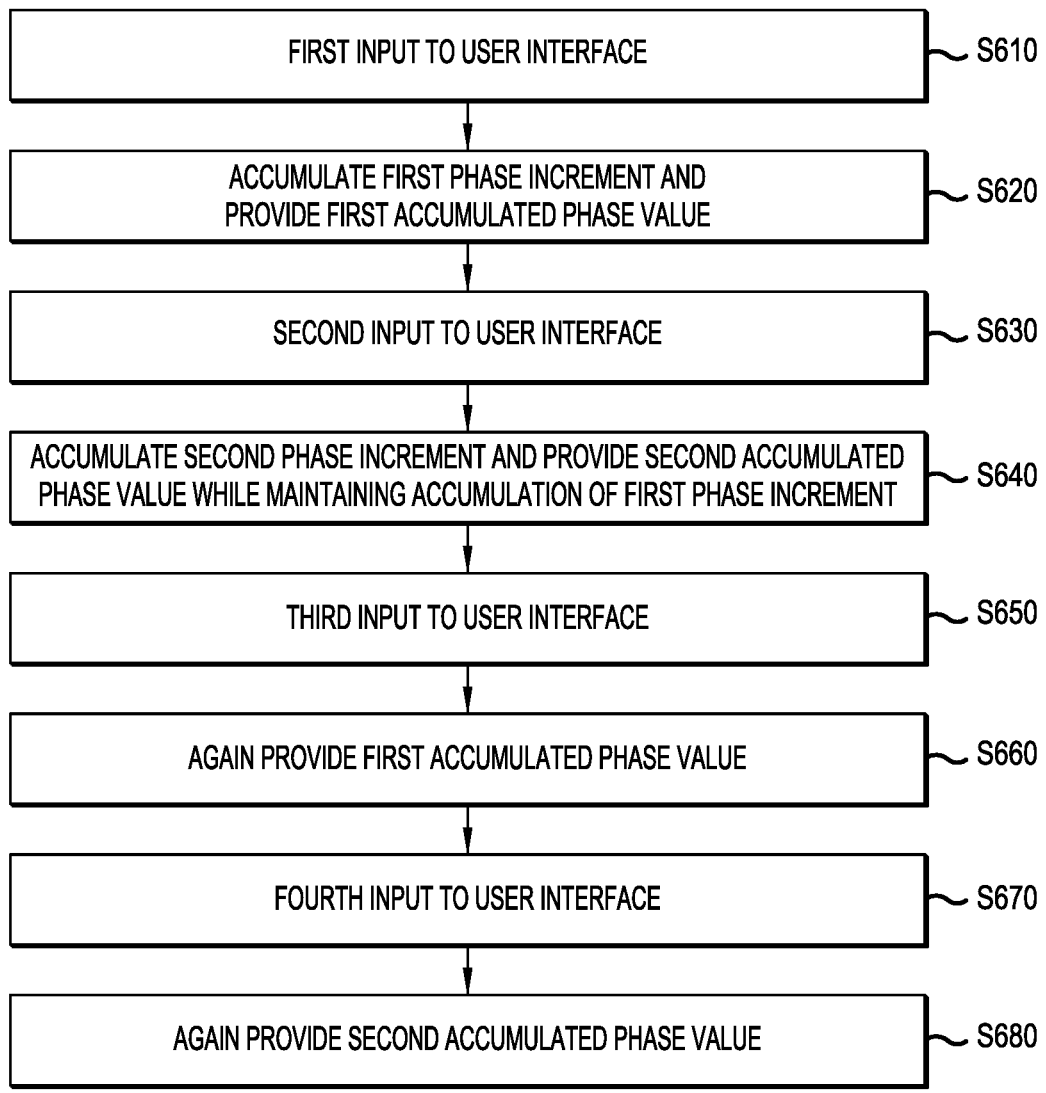
FIG. 6 illustrates a method for continuous phase maintenance for switched frequencies using phase accumulators, in accordance with a representative embodiment.

FIG. 6 illustrates a method for continuous phase maintenance for switched frequencies using phase accumulators, in accordance with a representative embodiment.

The method of FIG. 6 starts at S610 when a system accepts a first input to a user interface. The first input may, for example, specify a frequency to use in testing a device under test (DUT).

At S620, the system accumulates a first phase increment and provides a first accumulated phase value as an output. S620 may be performed repeatedly over time. S620 may be performed by a first phase accumulator.

At S630, the system accepts a second input to the user interface. The second input may, for example, specify a second frequency, to use in testing a device under test. The second frequency may be different than the first or may be the same as the first. The second frequency may also be the same as the first frequency, but with an offset phase relative to the second frequency.

At S640, the system accumulates a second phase increment and provides a second accumulated phase value as an output. S640 is performed while maintaining accumulation of the first phase increment. The accumulation of the second phase increment is performed by a second phase accumulator different than the first phase accumulator. That is S640 is performed by a system that includes multiple phase accumulators, so that one phase accumulator is used to accumulate the first phase increment for the first frequency and so that another phase accumulator is used to accumulate the second phase increment for the second frequency. The user may switch back and forth between the first frequency and the second frequency. Additionally, the system used for S640 is not limited to two phase accumulators, or even a single signal generator with multiple phase accumulators. Rather, the method of FIG. 6 may be performed by a system with more than two phase accumulators, and by a system with multiple signal generators each with two or more phase accumulators.

At S650, the system accepts a third input to the user interface. The third input may, for example, specify the first frequency again. That is, the third input may comprise an instruction to return to the first frequency.

At S660, the system again provides the first accumulated phase value as an output. That is, the system maintains the accumulation of the first accumulated phase value at S640 even when the system changes the output, so at S660 the system may be switching the output without having to restart the first phase accumulator.

At S670, the system accepts a fourth input to the user interface. The fourth input may, for example, specify the first frequency again, and may comprise an instruction to return to the second frequency.

At S680, the system again provides the second accumulated phase value as an output.

In an embodiment, dedicated hardware implementations, such as application-specific integrated circuits (ASICs), field programmable gate arrays (FPGAs), programmable logic arrays and other hardware components, are constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing may implement one or more of the methods or functionalities as described herein, and a processor described herein may be used to support a virtual processing environment.

Accordingly, continuous phase maintenance for switched frequencies using phase accumulators enables phase continuous operations in a system in which frequencies are changed. Phase continuity may be maintained when frequencies are changed for frequency and phase management for controlling quantum bit (qubit) gate primitives using a digital up down converter while operating in a real-time operation manipulation. Operations of a system may be returned to an earlier frequency such that the earlier frequency is phase continuous as if the frequency had not been changed. The teachings herein allow for multiple digital local oscillators to be frequency and phase multiplexed in a way that allows for phase continuous operation, while avoiding discontinuity in phase output which occurs in the traditional implementations of a numerically controlled oscillator (NCO) when the frequency of the local oscillator output is changed by changing the phase increment fed into a phase accumulator. The teachings herein may be used to change the behavior of qubits so as to avoid losing track of the state of the qubits.

Although continuous phase maintenance for switched frequencies using phase accumulators has been described with reference to several exemplary embodiments, it is understood that the words that have been used are words of description and illustration, rather than words of limitation. Changes may be made within the purview of the appended claims, as presently stated and as amended, without departing from the scope and spirit of continuous phase maintenance for switched frequencies using phase accumulators in its aspects. Although continuous phase maintenance for switched frequencies using phase accumulators has been described with reference to particular means, materials and embodiments, continuous phase maintenance for switched frequencies using phase accumulators is not intended to be limited to the particulars disclosed; rather continuous phase maintenance for switched frequencies using phase accumulators extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. An integrated phase accumulator apparatus, comprising:
  a first phase accumulator configured to accumulate a first phase increment over time determined by a phase increment calculator, and provide a first accumulated phase value for signal generation via a local oscillator at a first frequency;
  a second phase accumulator configured to accumulate a second phase increment over time determined by said phase increment calculator, and provide a second accumulated phase value for signal generation via the local oscillator at a second frequency; and
  a switch configured to switch the integrated phase accumulation apparatus between the first frequency and the second frequency and between the second frequency and the first frequency so as to maintain a first continuous phase for the first frequency and a second continuous phase for the second frequency.

2. The integrated phase accumulation apparatus of claim 1, further comprising:
  a third phase accumulator configured to accumulate a third phase increment over time and provide a third accumulated phase value for signal generation via the local oscillator at a third frequency, wherein the switch is further configured to switch the integrated phase accumulation apparatus between the first frequency and the third frequency, between the second frequency and the third frequency, between the third frequency and the first frequency and between the third frequency and the second frequency so as to maintain the first continuous phase for the first frequency, the second continuous phase for the second frequency, and a third continuous phase for the third frequency.

3. The integrated phase accumulation apparatus of claim 1, further comprising:

a user interface configured to accept input to change the local oscillator from the first frequency to the second frequency and from the second frequency to the first frequency.

4. The integrated phase accumulation apparatus of claim 3, further comprising:
a multiplexer that outputs phase to the local oscillator from one of the first phase accumulator or the second phase accumulator based on input from the user interface.

5. The integrated phase accumulation apparatus of claim 1, wherein the first phase accumulator comprises a first phase increment register and a first phase accumulator register, and wherein the second phase accumulator comprises a second phase increment register and a second phase accumulator register.

6. The integrated phase accumulation apparatus of claim 1, wherein the first phase accumulator comprises a plurality of first phase increment registers and a plurality of first phase accumulator registers for supersampled signals, and wherein the second phase accumulator comprises a plurality of second phase increment register and a plurality of second phase accumulator registers for supersampled signals.

7. The integrated phase accumulation apparatus of claim 1, further comprising:
a first multiplier dedicated to the first phase accumulator;
a second multiplier dedicated to the second phase accumulator; and
at least one shared multiplier shared by the first phase accumulator and the second phase accumulator, or a third multiplier dedicated to the first phase accumulator and a fourth multiplier dedicated to the second phase accumulator.

8. The integrated phase accumulation apparatus of claim 1, wherein a phase preset calculator is configured to determine a phase preset value to initialize or adjust the first and second phase accumulators to either a phase preset value or an accumulated phase increment, when the integrated phase accumulation apparatus switches between the first frequency and the second frequency, and
wherein a continuously increasing phase value is generated and processed by a phase-to-amplitude converter for synthesis of a desired waveform.

9. An signal generator, comprising:
a first integrated phase accumulation apparatus comprising a first phase accumulator configured to accumulate a first phase increment over time, and provide a first accumulated phase value for signal generation via a first local oscillator at a first frequency; a second phase accumulator configured to accumulate a second phase increment over time and provide a second accumulated phase value for signal generation via the first local oscillator at a second frequency; a first switch configured to switch the first integrated phase accumulation apparatus between the first frequency and the second frequency and between the second frequency and the first frequency so as to maintain a first continuous phase for the first frequency and a second continuous phase for the second frequency; and a phase preset calculator configured to determine a phase preset value to initialize or adjust the first and second phase accumulators to either a phase preset value or an accumulated phase increment.

10. The signal generator of claim 9, the first integrated phase accumulation apparatus further comprising:
a fifth phase accumulator configured to accumulate a fifth phase increment over time and provide a fifth accumulated phase value for signal generation via the first local oscillator at a fifth frequency, wherein the first switch is further configured to switch the first integrated phase accumulation apparatus between the first frequency and the fifth frequency, between the second frequency and the fifth frequency, between the fifth frequency and the first frequency and between the fifth frequency and the second frequency so as to maintain the first continuous phase for the first frequency, the second continuous phase for the second frequency, and a fifth continuous phase for the fifth frequency.

11. The signal generator of claim 9, the first integrated phase accumulation apparatus further comprising:
a user interface configured to accept input to change the first local oscillator from the first frequency to the second frequency and from the second frequency to the first frequency, and configured to accept input to change the second local oscillator from the third frequency to the fourth frequency and from the fourth frequency to the third frequency.

12. The signal generator of claim 11, the first integrated phase accumulation apparatus further comprising:
a multiplexer that outputs phase to the first local oscillator from one of the first phase accumulator or the second phase accumulator based on input from the user interface.

13. The signal generator of claim 9, wherein the first phase accumulator comprises a first phase increment register and a first phase accumulator register, and wherein the second phase accumulator comprises a second phase increment register and a second phase accumulator register.

14. The signal generator of claim 9, wherein the first phase accumulator comprises a plurality of first phase increment registers and a plurality of first phase accumulator registers for supersampled signals, and wherein the second phase accumulator comprises a plurality of second phase increment register and a plurality of second phase accumulator registers for supersampled signals.

15. The signal generator of claim 9, further comprising:
a first multiplier dedicated to the first phase accumulator;
a second multiplier dedicated to the second phase accumulator; and
at least one shared multiplier shared by the first phase accumulator and the second phase accumulator.

16. The signal generator of claim 9, further comprising:
a first multiplier dedicated to the first phase accumulator;
a second multiplier dedicated to the second phase accumulator;
a third multiplier dedicated to the first phase accumulator; and
a fourth multiplier dedicated to the second phase accumulator.

17. The signal generator according to claim 9, further comprising a second integrated phase accumulation apparatus comprising a third phase accumulator configured to accumulate a third phase increment over time and provide a third accumulated phase value for signal generation via a second local oscillator at a third frequency; a fourth phase accumulator configured to accumulate a fourth phase increment over time and provide a fourth accumulated phase value for signal generation via the second local oscillator at a fourth frequency; and a second switch configured to switch the first integrated phase accumulation apparatus between the third frequency and the fourth frequency and between the fourth frequency and the third frequency so as to maintain a third continuous phase for the third frequency and a fourth continuous phase for the fourth frequency.

18. An integrated phase accumulator system, comprising:

a first phase accumulator comprising a first instance of a sampling circuit and configured to accumulate a first phase increment over time and provide a first accumulated phase value for signal generation via a local oscillator at a first frequency;

a second phase accumulator comprising a second instance of a sampling circuit and configured to accumulate a second phase increment over time and provide a second accumulated phase value for signal generation via the local oscillator at a second frequency;

a switch configured to switch the integrated phase accumulator system between the first frequency and the second frequency and between the second frequency and the first frequency so as to maintain a first continuous phase for the first frequency and a second continuous phase for the second frequency; and at least one additional set of at least one additional sampling circuit connected to the first or second instance of the sampling circuit and configured for supersampling.

19. The integrated phase accumulator system of claim 18, wherein the at least one additional set of at least one additional sampling circuit comprises a first additional sampling circuit provided in the first phase accumulator for supersampling and a second additional sampling circuit provided in the second phase accumulator for supersampling.

20. The integrated phase accumulator system of claim 18, wherein the at least one additional set of at least one additional sampling circuit comprises:

a first additional sampling circuit and a second additional sampling circuit provided external to the first phase accumulator and the second phase accumulator to be shared for supersampling.

* * * * *